United States Patent [19]

Shenoy et al.

[11] Patent Number: 5,619,153

[45] Date of Patent: Apr. 8, 1997

[54] FAST SWING-LIMITED PULLUP CIRCUIT

[75] Inventors: Michael A. Shenoy, San Jose; Ted Williams; Robert K. Montoye, both of Los Gatos, all of Calif.

[73] Assignee: HAL Computer Systems, Inc., Campbell, Calif.

[21] Appl. No.: 496,275

[22] Filed: Jun. 28, 1995

[51] Int. Cl.⁶ .................. H03K 19/094; H03K 19/0948
[52] U.S. Cl. .................. 327/112; 327/374; 327/391; 327/437
[58] Field of Search .................. 327/112, 108, 327/313, 374, 376, 377, 391, 375, 382, 205, 190, 434, 436, 437, 483

[56] References Cited

U.S. PATENT DOCUMENTS

| | | | |
|---|---|---|---|
| 4,542,310 | 9/1985 | Ellis et al. | 327/112 |
| 4,806,787 | 2/1989 | Kato et al. | 327/205 |
| 4,883,975 | 11/1989 | Enomoto et al. | 327/205 |
| 4,918,341 | 4/1990 | Galbraith et al. | 327/51 |
| 4,985,644 | 1/1991 | Okihara et al. | 326/27 |
| 5,404,051 | 4/1995 | Kobayashi | 327/483 |
| 5,426,385 | 6/1995 | Lai | 327/374 |
| 5,430,335 | 7/1995 | Tanoi | 327/313 |
| 5,450,356 | 9/1995 | Miller | 327/391 |

Primary Examiner—Timothy P. Callahan
Assistant Examiner—My-Trang Nu Ton
Attorney, Agent, or Firm—Skjerven, Morrill, MacPherson, Franklin & Friel LLP

[57] ABSTRACT

A pullup circuit having a limited voltage swing and fast pullup and pulldown times comprises a pullup structure, a pulldown structure and an internal node. The pullup circuit operates to limit the current of the pullup structure before the N-tree discharges the internal node, thereby reducing the pullup effect of the pullup structure to reduce fall time and power consumption. Then the pullup circuit maximizes the current of the pullup structure after the N-tree has pulled down the internal node to increase the pullup effect of the pullup structure to reduce rise time. As a result, the voltage of the internal node both charges more quickly when the N-tree becomes inactive and discharges more quickly when the N-tree becomes active.

7 Claims, 2 Drawing Sheets

5,619,153

FAST SWING-LIMITED PULLUP CIRCUIT

FIELD OF THE INVENTION

This invention relates to pullup circuits and, more particularly, to static pullup circuits for use with CMOS circuits.

BACKGROUND INFORMATION

FIG. 1 shows a diagram of a conventional static pullup circuit 100 commonly used in CMOS integrated circuits for high speed applications. The term CMOS is also used herein to refer to complementary MOS structures using silicon gate technologies. An N-tree 110 operates to pull down the voltage at an output line 101 when active and stops pulling down the voltage at output line 101 when not active. Output line 101 is coupled to pullup circuit 100 at an internal node 120. Internal node 120 is connected to CMOS inverter 130 by an input lead 131. Thus, the logic level on internal node 120 is inverted by inverter 130 at an output lead 132. Output lead 132 is connected to the gate of pulldown P-channel field effect transistor (FET) 140 via feed back line 141. P-channel FET 140 has a source connected to internal node 120 and a drain held at ground potential. Thus, the output signal generated by inverter 130 feeds back to the gate of P-channel FET 140, thereby turning P-channel FET 140 on or off.

A P-channel FET 150, having a source connected to a Vdd voltage source and a drain connected to internal node 120 serves as a pullup device. P-channel FET 150 receives a signal PWR_BYPASS on a gate 151. In normal operation, signal PWR_BYPASS is kept at a logic low level (i.e., deasserted) by mode control circuitry (not shown), thereby causing P-channel FET to turn on. Consequently, a voltage divider is formed by pullup P-channel FET 150 and pulldown P-channel FET 140 through internal node 120, which determines the voltage at which node 120 is held when N-tree 110 is not active.

The PWR_BYPASS signal is used to place pullup circuit 100 in a power bypass mode, which stops all power consumption by pullup circuit 100. Thus, when pullup circuit 100 is not in operation (e.g., during testing) the PWR_BYPASS signal can be asserted (i.e., driven to a logic high level) to enter the power bypass mode. When the PWR_BYPASS signal is asserted, pullup P-channel FET 150 is turned off, thereby cutting off any DC current path through node 120 from the voltage Vdd source and the source of ground potential. As a result, substantially no power is consumed by pullup circuit 100. Further, an N-channel FET 160, having a drain connected to node 120 and a source held at ground potential, receives the PWR_BYPASS signal at a gate 161. Thus, when the PWR_BYPASS signal is asserted, pull-down N-channel FET 160 is activated, thereby pulling down the voltage at internal node 120 to a logic low level. The logic low voltage level at internal node 120 causes inverter 130 to output a logic high output signal on output lead 132, thereby providing a deterministic high output state for pullup circuit 100 when in the power bypass mode.

Pullup circuit 100 operates as follows. When inverter 130 is generating a logic high signal on output lead 132 (i.e, N-tree 110 is pulling down the voltage at internal node 120), the gate of pulldown P-channel FET 140 receives the logic high signal via line 141 and is turned off. The "low" voltage at node 120 is determined by the device ratio of pullup FET 150 to N-tree 110, which is designed to be below the threshold voltage of inverter 130 (i.e., the voltage above which inverter 130 generates a logic low output signal and below which inverter 130 generates a logic high output signal).

Then, when N-tree 110 is not active (i.e., N-tree 110 no longer pulls down the voltage at internal node 120), pullup FET 150, begins to pull up the voltage at internal node 120. Once the voltage of internal node 120 rises above the threshold voltage of inverter 130, inverter 130 generates a logic low signal, which causes pulldown FET 140 to become relatively more conductive (i.e., able to conduct more current). As a result, pulldown FET 140 begins to reduce the pull up effect of pullup FET 150, causing the voltage at node 120 to only rise slightly above the threshold voltage of inverter 130. Thus, when N-tree 110 later receives an input signal or signals (not shown) causing N-tree 110 to pull down the voltage at internal node 120, N-tree 110 does not have as much voltage to pull down, thereby reducing the pulldown time.

Consequently, the ratio of the sizes of P-channel FETs 140 and 150 directly determines the "high" voltage level of internal node 120. The designer can attempt to optimize the pulldown and pullup speeds by adjusting the size ratio of P-channel FETs 140 and 150, basically "trading off" pullup speed for pulldown speed.

SUMMARY

In accordance with the present invention, a pullup circuit is provided having a limited voltage swing and fast pullup and pulldown times. According to one embodiment of the present invention, a pullup circuit comprises a pullup structure, a pulldown structure and an internal node. The internal node is coupled to an output lead of an N-tree. When active, the N-tree discharges the internal node to a source of ground potential and when inactive, disconnects the internal node from the source of ground potential.

The pullup circuit operates to limit the current of the pullup structure before the N-tree discharges the internal node, thereby reducing the pullup effect of the pullup structure to reduce fall time and power consumption. Then the pullup circuit maximizes the current of the pullup structure after the N-tree has pulled down the internal node, thereby increasing the pullup effect of the pullup structure to reduce rise time. As a result, the voltage of the internal node both charges more quickly when the N-tree becomes inactive and discharges more quickly when the N-tree becomes active.

DETAILED DESCRIPTION

Figure 1:
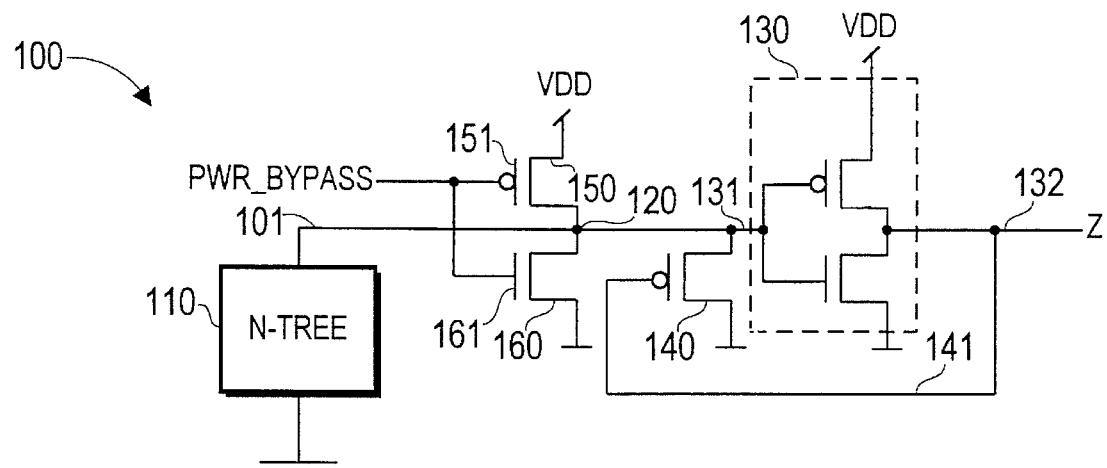
FIG. 1 (Prior Art) shows a schematic diagram of a conventional static pullup circuit.
Figure 2:
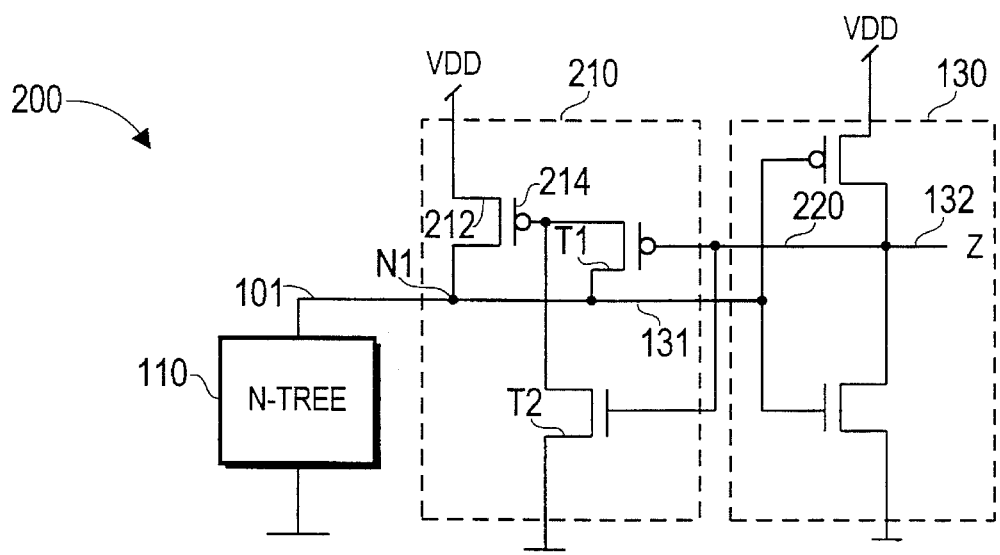
FIG. 2 shows a schematic diagram of a pullup circuit according to one embodiment of the present invention.

FIG. 2 shows static pullup circuit 200 according to one embodiment of the present invention. The same reference numbers are used between drawings when referring to elements having substantially identical structure and function. Pullup circuit 200 includes inverter 130 and a pullup structure 210 coupled to an internal node N1. Pullup structure 210 reduces the pull up effect of the pullup circuit, as compared to circuit 100 (FIG. 1), when internal node N1 is at the "high" voltage level. Therefore, pullup circuit 200 has a faster pullup speed for a given static power dissipation, or a lower static power dissipation for a given pullup speed.

Pullup structure 210 includes P-channel FETs 212 and T1 and N-channel FET T2. P-channel FET 212 has a source connected to the Vdd source and a drain connected to internal node N1 and serves as a pullup device for pulling up node N1. In this embodiment, voltage Vdd is approximately 3.3 V. P-channel FET T1 has a gate coupled to output lead 132 via line 220, a drain coupled to the gate of P-channel FET 212 and a source coupled to internal node N1. N-channel FET T2 has a gate coupled to output lead 132 via line 220, a source held at ground potential, and a drain connected to gate 214 of FET 212.

Pullup circuit 200 operates as follows. When inverter 130 outputs a logic low signal (i.e., pullup transistor 212 has pulled up the voltage of internal node N1 to a logic high level), the gates of P-channel FET T1 and N-channel FET T2 receive the logic low signal via line 220. As a result, P-channel FET T1 becomes more conductive, whereas N-channel FET T2 becomes less conductive. Thus, P-channel FET T1 pulls up the voltage of gate 214 to be substantially equal to the voltage at internal node N1. Because the voltage at gate 214 is increased, pullup FET 212 becomes less conductive, thereby limiting the amount of current pullup FET 212 can conduct if N-tree 110 begins to pull down the voltage at internal node N1. Thus, N-tree 110 discharges the internal node more quickly because N-tree 110 is "pulling down" against the reduced pullup effect of pullup FET 212.

When N-tree 110 is active and pulls down the voltage at internal node N1 to below the threshold voltage of inverter 130, inverter 130 transitions to output a logic high signal on output lead 132. The gates of P-channel FET T1 and N-channel FET T2 receive the logic high signal via line 220. As a result, P-channel FET T1 becomes less conductive, whereas N-channel FET T2 becomes more conductive. Thus, N-channel FET T2 pulls down the voltage of gate 214 to be substantially equal to ground potential, thereby mincreasing the current that pullup FET 212 can conduct. Accordingly, the current conducted by pullup FET 212 from the Vdd voltage source is now maximized to enable the fastest charge time for internal node N1 after N-tree 110 stops discharging internal node N1. Further, the voltage at internal node N1 is pulled up closer to the threshold voltage of inverter 130, thereby reducing the time needed for pullup FET 212 to pull the voltage at internal node N1 above the threshold voltage of inverter 130 after N-tree 110 stops discharging internal node N1.

After N-tree 110 stops discharging internal node N1 pullup FET 212 cannot pull up the voltage at internal node N1 any higher than a threshold voltage of pullup FET 212 (Vt) below voltage Vdd because otherwise pullup FET 212 will simply turn off. Accordingly, the voltage at internal node N1 has an upper limit of Vdd-Vt. Pullup circuit 200 is an improvement over pullup circuit 100 (FIG. 1) because pullup circuit 200 controls the current conducted by pullup FET 212 allowing the current to be a maximum during pullup and a minimum during pulldown.

Figure 3:
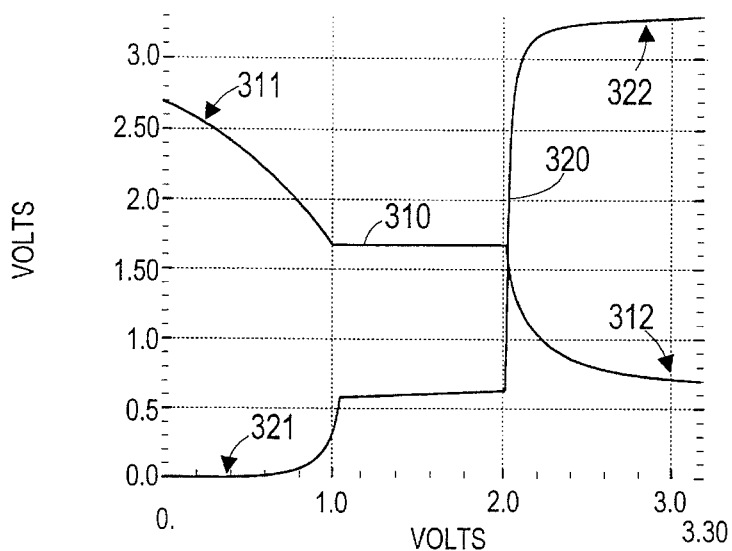
FIG. 3 illustrates the voltage characteristics of the pullup circuit depicted in FIG. 2.

FIG. 3 illustrates the voltage characteristics of pullup circuit 200. The x-axis is the voltage of an input signal received by N-tree 110 (not shown). When the input signal is asserted, N-tree 110 discharges internal node N1. The y-axis measures the voltage at either internal node N1 or output lead 132.

Curve 310 illustrates the voltage at internal node N1 as a function of voltage of the input signal to N-tree 110. Segment 311 of curve 310 illustrates the voltage of internal node N1 when the input signal to N-tree 110 is low. This low input voltage causes the N-channel transistors in N-tree 110 to turn off, thereby allowing pullup FET 212 to pull up the voltage at internal node N1. As described above, the voltage at internal node N1 is limited to approximately 2.7 V, which is approximately one Vt below the Vdd voltage of 3.3 V. Section 312 of curve 310 illustrates the voltage at internal node N1 when the input voltage to N-tree 110 is high. This high input voltage causes the N-channel transistors in N-tree 110 to turn on, thereby discharging internal node N1. The voltage at internal node N1 at this point is determined by the device ratio of P-channel FET T1 and N-tree 110. The upper limit of the voltage swing of internal node N1 is unaffected by this ratio, but instead depends on the Vt of pullup FET 212, as described above.

Curve 320 illustrates the voltage at output lead 132 as a function of voltage of the input signal to N-tree 110. Segment 321 of curve 320 illustrates the voltage of output lead 132 when the input signal to N-tree 110 is low. This low input voltage causes the voltage of internal node N1 to be high as shown by segment 311, which causes inverter 130 to output a logic low signal at output lead 132. Section 322 of curve 320 illustrates the voltage at output lead 132 when the input voltage to N-tree 110 is high. This high input voltage causes the voltage at internal node N1 to be low, which causes inverter 130 to output a logic high signal at output lead 132.

Figure 4:
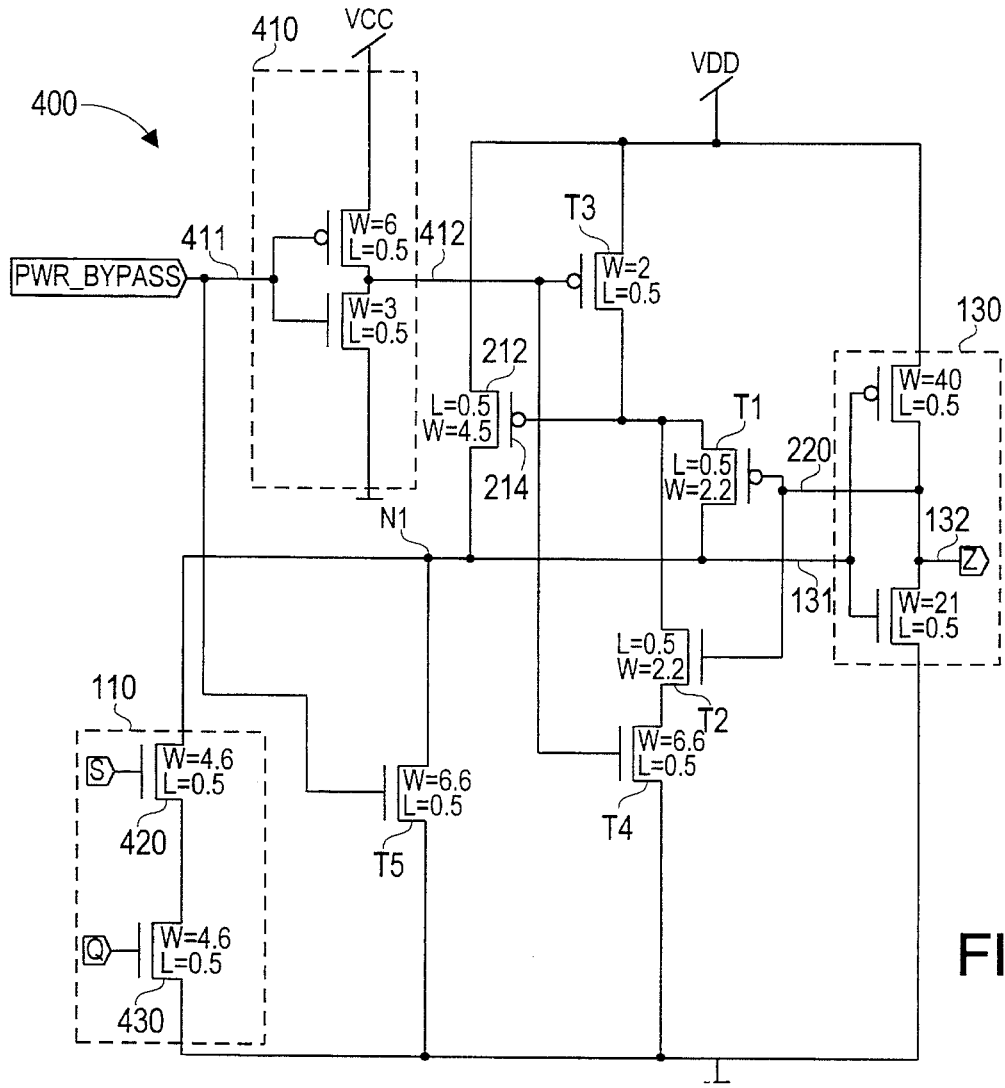
FIG. 4 shows a schematic diagram of a pullup circuit according to another embodiment of the present invention.

FIG. 4 shows a schematic diagram of a pullup circuit 400 according to another embodiment of the present invention having a power bypass mode similar to pullup circuit 100 (FIG. 1). Pullup circuit 400 is substantially identical to pullup circuit 200 (FIG. 2), except that: N-channel FET T2 has its source connected to the source of ground potential through a N-channel FET T4; gate 214 is coupled to the Vdd source through a P-channel FET T3; internal node N1 is coupled to the source of ground potential through a N-channel FET T5; and the addition of an inverter 410 coupled to receive the PWR_BYPASS signal and provide an inverted PWR_BYPASS signal to the gates of FETs T3 and T4.

In this embodiment, N-tree 110 comprises N-channel FETs 420 and 430. Of course, other embodiments of the N-tree are possible. N-channel FET 420 has a drain connected to internal node N1, a source coupled to a drain of N-channel FET 430 and a gate coupled to receive a S signal. N-channel FET 430 has a source coupled to a source of ground potential and a gate coupled to receive a Q signal. When signals S and Q are both asserted (i.e., at a logic high level), N-channel FETs 420 and 430 are both turned on, thereby pulling down the voltage at internal node N1. However, when one or both of signals S and Q are deasserted (i.e., at a logic low level), N-tree 110 no longer pulls down the voltage at internal node N1.

During normal operation, the PWR_BYPASS signal is deasserted (i.e., held to a logic low), thereby turning on N-channel FET T4 and turning off N-channel FET T5 and P-channel FET T3 through inverter 410. Because N-channel FET T4 is on, N-channel FET T2 is coupled to the source of ground potential just as in pullup circuit 200 (FIG. 2). Further, because P-channel FET T3 and N-channel FET T5 are off, these FETs have substantially no effect on pullup circuit 400. Accordingly, when the PWR_BYPASS signal is deasserted, pullup circuit 400 operates in substantially the same manner as pullup circuit 200 (FIG. 2).

The PWR_BYPASS signal is asserted (i.e., set to a logic high level) to enter the power bypass mode. The asserted PWR_BYPASS signal is inverted by inverter 410, causing P-channel FET T3 to become conductive and pull up the voltage at gate 214, thereby causing pullup FET 212 to turn off. Further, the inverted asserted PWR_BYPASS signal also turns off N-channel FET T4, thereby causing an open circuit in the DC current path from Vdd power source to the source of ground potential through P-channel FET T3 and N-channel FET T2. However, the asserted PWR_BYPASS signal turns on N-channel FET T5, thereby discharging internal node N1 to a logic low level. As a result, inverter 130 outputs a logic high signal on output lead 132, thereby providing a deterministic high output state for pullup circuit 400 when in the power bypass mode. The logic high signal on output lead 132 is also received at the gate of P-channel FET T1 via line 220, which turns off P-channel FET T1, thereby providing another open circuit in the DC current path between Vdd voltage source and the source of ground potential.

The foregoing has described the principles and preferred embodiments of the present invention. However, the invention should not be construed as being limited to the particular embodiments described. For example, different implementations of the N-tree may used. In addition, although the described embodiments are used in 3.3 V circuits, other embodiments may be adapted for use in 5 V circuits. Further, other embodiments may omit the inverter used to invert the PWR_BYPASS signal and use a N-channel FET for FET T3 and a P-channel FET for FET T4. Still further, embodiments may be adapted for implementation in different transistor technologies, such as JFETs, BiCMOS or bipolar technologies. Thus, the above-described embodiments should be regarded as illustrative rather than restrictive. Variations can be made to those embodiments by workers skilled in the art without departing from the scope of the present invention as defined by the following claims.

We claim:

1. A pullup circuit comprising:

an internal node;

an inverter having an input lead coupled to said internal node; and a pullup structure comprising:

a first transistor having a first current handling terminal coupled to a first voltage source and a second current handling terminal coupled to said internal node;

a second transistor having a gate coupled to an output lead of said inverter and a first current handling terminal coupled to a gate of said first transistor and a second current handling terminal coupled to said internal node; and a third transistor having a gate coupled to said output lead of said inverter, a first current handling terminal coupled to said gate of said first transistor and a second current handling terminal coupled to a second voltage source.

2. The pullup circuit of claim 1 wherein said pullup structure is capable of alternately forming a first current path between said gate of said first transistor and said internal node and a second current path between said gate of said first transistor and said second voltage source.

3. The pullup circuit of claim 1 wherein the amount of current said first transistor conducts has a first current value when a voltage at said internal node is greater than a threshold voltage of said inverter and wherein the amount of current said first transistor conducts has a second current value when said voltage at said internal node is less than said threshold voltage, said second current value being greater than said first current value.

4. The pullup circuit of claim 1 wherein said first transistor turns off when said internal node reaches a particular voltage, thereby limiting said internal node to said particular voltage, said particular voltage being less than a voltage of said first voltage source.

5. The pullup circuit of claim 4 wherein said particular voltage is equal to said voltage of said first voltage source minus a threshold voltage of said first transistor.

6. The pullup circuit of claim 1 wherein said first transistor is a P-channel field effect transistor whereby a voltage at said internal node is provided to said gate of said P-channel field effect transistor thereby reducing the amount of current said P-channel field effect transistor conducts when said voltage at said internal node is greater than a threshold voltage of said inverter.

7. A pullup circuit comprising:

an internal node;

an inverter having an input lead coupled to said internal node; and a pullup structure comprising:

a first transistor having a first current handling terminal coupled to a first voltage source and a second current handling terminal coupled to said internal node;

a second transistor having a gate coupled to an output lead of said inverter and a first current handling terminal coupled to a gate of said first transistor and a second current handling terminal coupled to said internal node; and a third transistor having a gate coupled to said output lead of said inverter, a first current handling terminal coupled to said gate of said first transistor and a second current handling terminal coupled to a second voltage source, wherein said second voltage source provides a ground potential and wherein said first transistor is a P-channel field effect transistor whereby said ground potential is provided to said gate of said P-channel field effect transistor thereby increasing the amount of current said P-channel field effect transistor conducts when a voltage at said internal node is less than a threshold voltage of said inverter.

\* \* \* \* \*